Dec. 18, 1962 R. A. RUEHRWEIN 3,069,604
TUNNEL DIODE
Filed Aug. 17, 1960
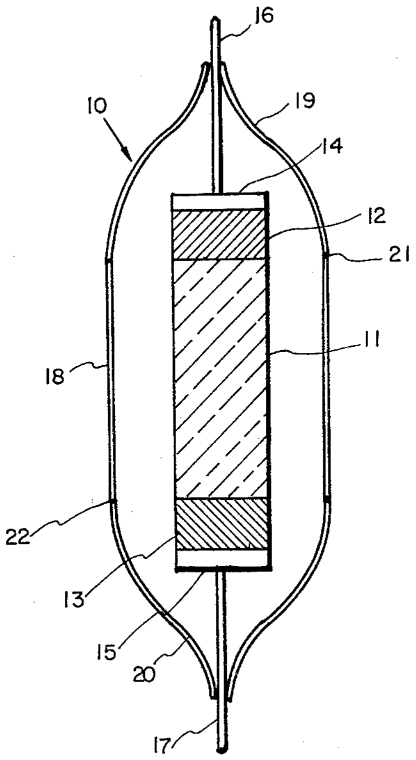
INVENTOR.
ROBERT A. RUEHRWEIN
BY Lloyd B. Stevens, Jr.
ATTORNEY United States Patent Office 3,069,604
Patented Dec. 18, 1962

3,069,604

TUNNEL DIODE

Robert Arthur Ruehrwein, Dayton, Ohio, assignor to Monsanto Chemical Company, St. Louis, Mo., a corporation of Delaware Filed Aug. 17, 1960, Ser. No. 50,284
8 Claims. (Cl. 317—234)

The invention relates to a tunnel diode having a cubic boron phosphide semiconductor body or element as a part thereof.

Tunnel diodes have certain advantages over conventional diodes, the principal advantage being one of high speed operation. In general tunnel diodes offer many physical and electrical advantages over conventional semiconductor devices; these include: potential low cost, environmental ruggedness, reliability, low power dissipation, high-frequency capability and low-noise properties. Thus, the tunnel diode is assured a useful and significant place in electronics circuit applications. Materials such as germanium and gallium arsenide which have previously been used in tunnel diodes have the disadvantages of having a small voltage swing, the voltage range over which the diode exhibits negative resistance. Heretofore, the maximum voltage swing that has been demonstrated is about one volt. The large energy gap of boron phosphide allows the construction of a tunnel diode having a voltage swing of several volts possibly even up to 5 or 6 or more volts with cubic boron phosphide being used as the semiconductor material in the diode. To be useful in tunnel diode devices, boron phosphide crystals must be doped to a carrier density of about $10^{19}$ to about $10^{21}$ per cubic centimeter, or at least to a sufficiently high carrier level to provide cubic boron phosphide crystals capable of forming P-N junctions with negative resistance characteristics. Doping agents from either groups IIB or VIB of Mendeleeff's Periodic Table and magnesium and beryllium can be used. In the tunnel diode device itself the barrier or transition region between the P and N-type regions should not have a thickness of more than about 200 Angstroms, preferably not more than about 100 Angstroms, but in any event the barrier region should be thin enough to give substantial tunneling probability, i.e., permit substantial tunnel current.

A number of different processes for producing crystalline cubic boron phosphide are known as illustrated by copending applications which are described hereinbelow.

Copending application Serial No. 718,463, filed March 3, 1958, now U.S. Patent No. 2,966,426, describes a process for producing crystalline boron phosphide which involves contacting a boron halide, hydride or alkyl with a phosphorus halide or hydride at a temperature of at least 1,100° F. If it is desired during the process of producing the boron phosphide a volatile chloride of a group IIB element or magnesium or beryllium can be added to the reactants in an amount sufficient to give a P-type boron phosphide crystalline material having a carrier density high enough that the material is capable of forming P-N junctions with negative resistance characteristics. If an N-type material is desired a group VIB element can be added during the process in amounts sufficient to give an N-type crystalline boron phosphide having a carrier density high enough that the boron phosphide is capable of forming P-N junctions with negative resistance characteristics. Actually during the process of making the crystalline boron phosphide whether doping agents are added or not, sufficient impurities will normally be picked up by the boron phosphide being formed to make it either N- or P-type. Doping of the boron phosphide of course, can be done after the formation of the crystalline boron phosphide by diffusion of the doping agents into the crystalline structure at elevated temperatures, but normally it is preferred to do the doping during the manufacture of the boron phosphide.

Another copending application Serial No. 718,464, filed March 3, 1958, now U.S. Patent No. 2,974,064, describes a process of producing crystalline boron phosphide by contacting a gaseous boron compound with elemental phosphorus and hydrogen at a temperature of at least 1,100° F. Doping during the manufacture of the boron phosphide is conducted, if desired, in a manner similar to that described for the process of application S.N. 718,463 hereinabove.

In application Serial No. 718,465, filed March 3, 1958, describes a process of producing crystalline boron phosphide by heating a metal phosphide and a metal boride in an inorganic matrix. In this process doping to form N-type material can be accomplished by adding oxygen or sulfur preferably an oxide or a sulfide in small amounts to the inorganic matrix. Actually, the preferred element in all the processes for doping to obtain N-type conductivity are selenium and tellurium, and in this process selenium and tellurium could be added directly to the melt. To obtain P-type boron phosphide crystals by doping, beryllium, magnesium, zinc, cadmium or mercury metals can be added to the melt of this process, preferably beryllium, magnesium, zinc or cadmium.

Copending application Serial No. 823,329, filed June 29, 1959, describes a process for producing cubic crystalline boron phosphide of N-type conductivity involving contacting a gaseous stream of boron suboxide with a gaseous stream of elemental phosphorus at a temperature in the range of about 1,000° C. to 1,800° C. and precipitating boron phosphide from the gas phase. Doping to change the degree or type of conductivity, if desired, is carried out in this method in a manner similar to that described for application S.N. 718,463, hereinabove.

Application Serial No. 823,360, filed June 29, 1959, describes a process of producing single crystals of boron phosphide. In this process a crude source of boron phosphide is contacted with a hydrogen halide vapor at a temperature in the range of from 600 to 1,500° C. and the resulting gaseous mixture is subjected to a higher temperature in the range of from 800 to 1,800° C. using a temperature increase from the first zone of contacting to the second zone of contacting of from 50° C. to 1,000° C. with the resultant production of a single crystal of boron phosphide in the second zone. Doping, if desired, to vary the degree or type of conductivity can be carried out in a manner similar to that described hereinabove for application S.N. 718,463.

Doping boron phosphide after the formation of the boron phosphide crystals, a method not quite so desirable as doping during the manufacture of the crystals, can be carried out as follows: A crystal of cubic boron phosphide which can have an initial carrier density of about $10^{18}$/cc. or less is heated in the presence of a vapor of an acceptor element. For example, the crystal can be heated in the presence of vapor of cadmium or zinc at high temperatures for a sufficient time to allow the cadmium or zinc to diffuse into the cubic boron phosphide to give a carrier density (P-type) high enough that the boron phosphide is capable of forming P-N junctions with negative resistance characteristics. This heating step in the presence of a doping agent must also be carried out in the presence of phosphorus vapor at a pressure in excess of the dissociation pressure of boron phosphide. The heat treatment can be carried out by placing the boron phosphide, the cadmium or zinc and phosphorus in an evacuated tube and sealing off the tube. For example, a gas-tight porcelain closed end tube is sealed to a section of Pyrex tube which in turn can be sealed off after the evacuation of residual gas is completed at room or slightly elevated temperatures. The sealed tube is then placed in a furnace at about 1600° C. with the Pyrex end of the sealed tube at a lower temperature of about 400 to 600° C., preferably at a temperature that will maintain a phosphorus pressure of about 1 to 10 atmospheres, and will maintain a cadmium or zinc pressure sufficient to dope the boron phosphide to the desired level.

Similarly, a N-type boron phosphide crystal is prepared first by heating a boron phosphide crystal together with phosphorus and sulfur in a porcelain tube at about 1600° C. with the Pyrex end of the sealed tube at a temperature tc give a phosphorus vapor of 1 to 10 atmospheres. The amount of phosphorus charged to the tube is preferably in excess of the amount required to form $P_4S_3$ with the amount of sulfur added. The heating period will be somewhat comparable for the period required to form P-type material and may involve a heating time for as much as a week or more, in any event until the carrier concentration in the boron phosphide crystal is high enough that the crystal is capable of forming P–N junctions with negative resistance characteristics. It may be desirable to use somewhat lower or somewhat higher heating temperatures to attain optimum conditions in the production of either the N-type or P-type material.

The making of a tunnel diode, e.g. from N-type crystalline boron phosphide doped to the required level, is illustrated as follows: A crystal of N-type boron phosphide doped to a carrier concentration high enough to give a crystal capable of forming a P-N junction with negative resistance characteristics is used as the semiconductor material. A small drop of a metal alloy is fused to the boron phosphide crystal in order to form the required thin P-N junction. This drop of metal alloy consists of e.g. cadmium or zinc in platinum, iron or nickel. This fusion is best carried out on a small strip heater in an inert atmosphere such as hydrogen or argon. Leads are then secured to the alloy dot and to the boron phosphide crystal. One way of attaching a lead to the alloy dot is by plating the dot with copper to which a copper wire can then be soldered. A suitable way of attaching a lead to the boron phosphide crystal is by fusing platinum thereto followed by copper plating the platinum and soldering a copper wire lead to the copper plated platinum. It is not necessary to encapsulate the tunnel diode since surface effects are usually negligible, but it is useful to mount the diode in a small glass or metal envelope to protect it from mechanical damage. Potting the tunnel diode in a plastic is also a desirable method of mounting it.

At the end of the heating and doping step, the boron phosphide crystal is cooled or quenched rapidly to trap the doping agent within the crystal lattice. This is of course, the conventional diffusion and quench method used for doping semiconductor materials. If the material is cooled slowly rather than being quenched, the doping agent may diffuse right out of the crystal lattice again.

If a heavy doped P-type boron phosphide crystal rather than an N-type is employed, the alloy dot employed would be for example, platinum, iron or nickel containing sulfur, selenium or tellurium.

Tunnel diodes made from boron phosphide in addition to exhibiting a large voltage swing have the advantage in that they can be used at high temperature, up to about 1000° C. For operation of about 600° C. or higher, the alloy dot is preferably iron or nickel and the mounting envelope must be a high melting material such as quartz or nickel.

Broadly speaking the tunnel diode of the invention is usable at high temperature, comprises a crystalline boron phosphide semiconductor body having a carrier density high enough to give a body capable of forming a P-N junction with negative resistance characteristics, a conductor attached to the semiconductor body forming an ohmic junction therewith, and the required thin P–N junction as a part of the diode.

The invention will be more clearly understood from the following detailed description of the specific example thereof read in conjunction with the accompanying drawing wherein:

In the FIGURE is a sectional view of an embodiment of the invention.

In the figure is shown tunnel diode 10. A single crystal of cubic boron phosphide having N-type conductivity with a carrier density high enough to give a crystal capable of forming P-N junctions with negative resistance characteristics constitutes semiconductor body 11 of the diode. Suitably semiconductor body 11 is in the form of a thin disc or wafer of boron phosphide. To form the P-N junction on the semiconductor body, nickel conductor 12, having 10% by weight based on nickel, of cadmium incorporated therein is fused to one side of disc 11. This fusion is accomplished by pressing conductor 12 suitably in the form of a small bead against one side of disc 11 at an elevated temperature of about 1100° C. and allowing sufficient time for cadmium in the nickel conductor to fuse into the surface of disc 11 thereby conductor 12 is fused, soldered or welded to disc 11. It is desirable to restrict the cross sectional area of the nickel bead which is in contact with disc 11 to as small a cross section as possible in order to limit current flow through the device 10. This can be accomplished by a number of techniques including: using as small a bead as possible, restricting the time, temperature and pressure of the bead against disc 11 and etching away a portion of disc 11 in contact with bead 12 by the use of, for example, molten sodium hydroxide. There is another reason why the time, temperature and pressure used in fusing bead 12 to disc 11 should be carefully restricted and this is to prevent the formation of barrier layer having a thickness of more than about 200 Angstroms and preferably not more than about 100 Angstroms. Too high a pressure, too high a temperature and too long a time of contact of the bead 12 with disc 11 during fusion will tend to produce too thick a barrier layer.

An ohmic junction is made to the other side of disc 11 by fusing a nickel electrode 13 having 10% by weight based on nickel of tellurium therein to the bottom portion of disc 11 in a similar manner to that described for fusing conductor 12 to the other side of disc 11. For attaching leads to diode 10 a desirable way is to copper plate nickel beads 12 and 13 such as is shown by copper layers 14 and 15 respectively. A copper coating can also be applied to the beads using copper paint, metalizing spray techniques or other similar means. Having applied the coatings 14 and 15 to beads 12 and 13 respectively, it is very easy to make copper lead connections 16 and 17 to these copper coatings 14 and 15 by the simple expedient of soldering.

Another method of making ohmic contact with wafer 11 is to fuse a platinum contact 13 to the lower surface of wafer 11. In fusing the platinum contact to the wafer a sufficiently high temperature, preferably not more than about 800° C. is used.

Ohmic contact can also be made to N or P-type boron phosphide by the use of tungsten coated with tellurium or cadimum respectively. Molybdenum can be substituted for tungsten for this purpose.

Instead of forming the N-P junction between conductor 12 and wafer 11, wafer 11 can be manufactured having an internal N-P junction. Starting with N-type boron phophide a rectifying junction can be made by diffusing a group IIB metal, e.g. cadmium or magnesium or beryllium into one side of the wafer producing a P-type surface. On the other hand starting with a P-type boron phosphide, a rectifying junction can be made by diffusing a group VIB element into one side of the wafer.

Another method for making a N-P junction is to add the proper doping material, or to change the type of doping material, (from group IIB to group VIB magnesium and beryllium elements) during the growth of the crystals.

Still another method of producing P-N junctions is the heating of an N-type boron phosphide wafer to high temperatures (about 1200° C.) in vacuum. In this case phosphorus is lost by out diffusion which results in a P-type boron-rich, layer on the surface.

With junctions formed by any of the above methods, contact can be made to the N- or P-type sides using nickel alloyed with tellurium or cadmium respectively in amounts mentioned previously.

If it is desired to encapsulate the device, enclosing in a glass-metal envelope is suitable or potting in a plastic as has been previously stated. In the figure, glass envelope 18 plus conventional metal glass-metal seals 19 and 20 are used to encapsulate the diode. In a conventional manner metal seal 19 is fused to glass envelope 18 and soldered or welded to lead 16, and in like manner metal seal 20 is attached to envelope 18 and lead 17 thus completely encapsulating the tunnel diode. Within the capsule any type of atmosphere desired can be provided or vacuum by conventional techniques.

It is indicated hereinabove that nickel having 10% by weight based on nickel of cadmium or tellurium is useful for making ohmic or P-N contacts to boron phosphide, and zinc or selenium, respectively could be used to replace the cadmium or tellurium. Actually, mercury, beryllium or magnesium can be used instead of zinc or cadmium; and oxygen or sulfur can be used instead of selenium or tellurium; however, magnesium, beryllium, cadmium or zinc or mixtures thereof and selenium or tellurium or mixtures thereof are the preferred elements to use. Normally, it will be desirable to use not more than about 20%, preferably not more than about 15%, by weight of the groups IIB and VIB elements, magnesium and beryllium in the nickel based on the nickel; however, larger amounts can be used but in any event the mixture of nickel and these elements should consist primarily of nickel on a weight basis, i.e. nickel having minor amounts of these elements therein. Other conductors than nickel having high melting points can be used in place of conductors 12 and 13, e.g. iron, silver, gold, copper, etc. The group IIB, magnesium and beryllium or group VIB doping agents would be incorporated in these other metals in the same proportion as they were in nickel for the device of the figure. These other conducting metals would then replace nickel conductors 12 and 13 of the figure.

Although the invention has been described in terms of specified apparatus which is set forth in considerable detail, it should be understod that this is by way of illustration only and that the invention is not necessarily limited thereto since alternative embodiments and operating techniques will become apparent to those skilled in the art in view of the disclosure. Accordingly, modifications are contemplated which can be made without departing from the spirit of the described invention.

What is claimed is:

1. A tunnel diode comprising a semiconductor body of cubic boron phosphide having a carrier density high enough that the body is capable of forming P-N junctions with negative resistance characteristics, a first conductor attached to said semiconductor body forming an ohmic junction therewith, and a second conductor attached to said semiconductor body whereby a P-N junction with a barrier region thin enough to permit substantial tunnel current is formed.

2. The diode of claim 1 wherein the barrier layer has a thickness of not more than about 200 Angstroms.

3. The diode of claim 2, wherein said first conductor has a minor amount of an element selected from groups IIB and VIB of Mendeleeff's Periodic Table, magnesium and beryllium, said first conductor being fused to said semiconductor body.

4. The diode of claim 3, wherein said second conductor having a minor amount of an element selected from groups IIB and VIB of Mendeleeff's Periodic Table, magnesium and beryllium of the opposite conductivity type than said semiconductor body is fused thereto forming said P-N junction.

5. The diode of claim 4, wherein said semiconductor body is N-type, said first conductor is nickel and said element therein is selected from the class consisting of selenium and tellurium, and said second conductor is nickel and said element therein is selected from the class consisting of magnesium, beryllium, cadmium and zinc.

6. The diode of claim 4, wherein said semiconductor body is P-type, said first conductor is nickel and said element therein is selected from the class consisting of magnesium, beryllium, cadmium and zinc, and said second conductor is nickel and said element therein is selected from the class consisting of selenium and tellurium.

7. A tunnel diode comprising an N-type cubic boron phosphide semiconductor wafer having a carrier density high enough that the wafer is capable of forming P-N junctions with negative resistance characteristics, a nickel conductor having therein not more than about 15% based on nickel of an element selected from the class consisting of selenium and tellurium fused to one side of said wafer forming an ohmic junction therewith, and a nickel conductor having therein not more than about 15% by weight based on nickel of an element selected from the class consisting of cadmium and zinc fused to the other side of said wafer forming a P-N junction with a barrier layer having a thickness of not more than about 200 Angstroms.

8. A tunnel diode comprising a P-type cubic boron phosphide semiconductor wafer having a carrier density high enough that the wafer is capable of forming P-N junctions with negative resistance characteristics, a nickel conductor having therein not more than about 15% by weight based on nickel of an element selected from the class consisting of cadmium and zinc fused to one side of said wafer forming an ohmic junction therewith, and a second nickel conductor having therein not more than about 15% by weight based on nickel of an element selected from the class consisting of selenium and tellurium fused to the other side of said wafer forming a P-N junction with a barrier layer having a thickness of not more than about 200 Angstroms.

References Cited in the file of this patent

FOREIGN PATENTS 719,873 Germany ______________ Dec. 8, 1954